United States Patent
Asadi et al.

(10) Patent No.: US 11,342,027 B1
(45) Date of Patent: May 24, 2022

(54) SYSTEMS FOR ADAPTIVELY DETERMINING READ THRESHOLD VOLTAGE USING META INFORMATION

(71) Applicant: SK hynix Inc., Gyeonggi-do (KR)

(72) Inventors: Meysam Asadi, Fremont, CA (US); Aman Bhatia, Los Gatos, CA (US); Fan Zhang, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/103,513

(22) Filed: Nov. 24, 2020

(51) Int. Cl.
- *G11C 7/00* (2006.01)
- *G11C 16/10* (2006.01)
- *G11C 16/26* (2006.01)
- *G11C 16/34* (2006.01)
- *G11C 16/30* (2006.01)

(52) U.S. Cl.
CPC ............. *G11C 16/10* (2013.01); *G11C 16/26* (2013.01); *G11C 16/30* (2013.01); *G11C 16/3404* (2013.01); *G11C 2211/561* (2013.01)

(58) Field of Classification Search
CPC ....... G11C 7/1051; G11C 7/22; G11C 7/1072; G11C 7/1006; G11C 7/1066
USPC ........................................ 365/189.15, 238.5
See application file for complete search history.

(56) References Cited

U.S. PATENT DOCUMENTS

| 8,116,141 | B2 | 2/2012 | Yoo et al. | |
| 10,771,094 | B2 | 9/2020 | Horisaki | |
| 2009/0228739 | A1* | 9/2009 | Cohen | G11C 16/3404 714/6.12 |
| 2012/0072794 | A1* | 3/2012 | Eguchi | G06F 11/0754 714/721 |

* cited by examiner

*Primary Examiner* — Son T Dinh
(74) *Attorney, Agent, or Firm* — IP & T Group LLP

(57) ABSTRACT

Embodiments adaptively determine a read retry threshold voltage for a next read operation using meta information collected from previous failed read data. A controller obtains meta information associated with a read operation on a select page, the meta information including a read threshold voltage set. The controller determines a mathematical model for estimating a checksum value for data associated with a next read operation, using a set function of the read threshold voltage set and a set checksum value. The controller determines a set of parameters by performing polynomial regression on the mathematical model. The controller estimates a next read threshold voltage for the next read operation based on the set of parameters.

20 Claims, 16 Drawing Sheets

SYSTEMS FOR ADAPTIVELY DETERMINING READ THRESHOLD VOLTAGE USING META INFORMATION

BACKGROUND

1. Field

Embodiments of the present disclosure relate to a scheme for adaptively determining a read threshold voltage in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various read threshold voltages to perform read operations or read retry operations.

SUMMARY

Aspects of the present invention include a system and a method for adaptively determining a read threshold voltage using meta information collected from previous failed read data.

In one aspect, a memory system includes a memory device including a plurality of pages and a controller. The controller obtains meta information associated with a read operation on a select page among the plurality of pages, the meta information including a read threshold voltage set; determines a mathematical model for estimating a checksum value for data associated with a next read operation, using a set function of the read threshold voltage set and a set checksum value; determines a set of parameters by performing polynomial regression on the mathematical model; and estimates a next read threshold voltage for the next read operation based on the set of parameters.

In another aspect, a memory system includes a memory device including a plurality of pages and a controller. The controller obtains meta information associated with read operations on a select page among the plurality of pages, the meta information including multiple read threshold voltage sets, multiple checksum values and percentages of bits of a specific value in data; determines a mathematical model for estimating a percentage of bits of a specific value in data for a next read operation, using a set function of the read threshold voltage set used for a current read operation; determines a set of parameters by performing linear regression on the mathematical model; determine a surface, which is formed by each set of the multiple read threshold voltage sets; determine a line of the surface based on the set of parameters; determines a best previous read threshold voltage set among the multiple read threshold voltage sets, based on the multiple checksum values; determines a point corresponding to the best previous read threshold voltage set in the surface; and estimates a next read threshold voltage for the next read operation by projecting the point onto the line.

In yet another aspect, a memory system includes a memory device including a plurality of pages and a controller. The controller obtains meta information associated with read operations on a select page among the plurality of pages, the meta information including multiple read threshold voltage sets, multiple checksum values and a percentage of bits of a specific value in data; determines a first mathematical model for estimating a checksum value data associated with for a next read operation, using a set function of the read threshold voltage set and a set checksum value; determines a first set of parameters by performing polynomial regression on the first mathematical model; estimates a first next read threshold voltage for the next read operation based on the first set of parameters; determines a second mathematical model for estimating a percentage of bits of specific value in data for the next read operation, using a set function of the read threshold voltage set used for a current read operation; determines a second set of parameters by performing linear regression on the second mathematical model; determine a surface, which is formed by each set of the multiple read threshold voltage sets; determine a line of the surface based on the second set of parameters; determines a best previous read threshold voltage set among the multiple read threshold voltage sets, based on the multiple checksum values; determines a point corresponding to the best previous read threshold voltage set in the surface; and estimates a second next read threshold voltage for the next read operation by projecting the point onto the line.

Additional aspects of the present invention will become apparent from the following description.

DETAILED DESCRIPTION

Figure 1:
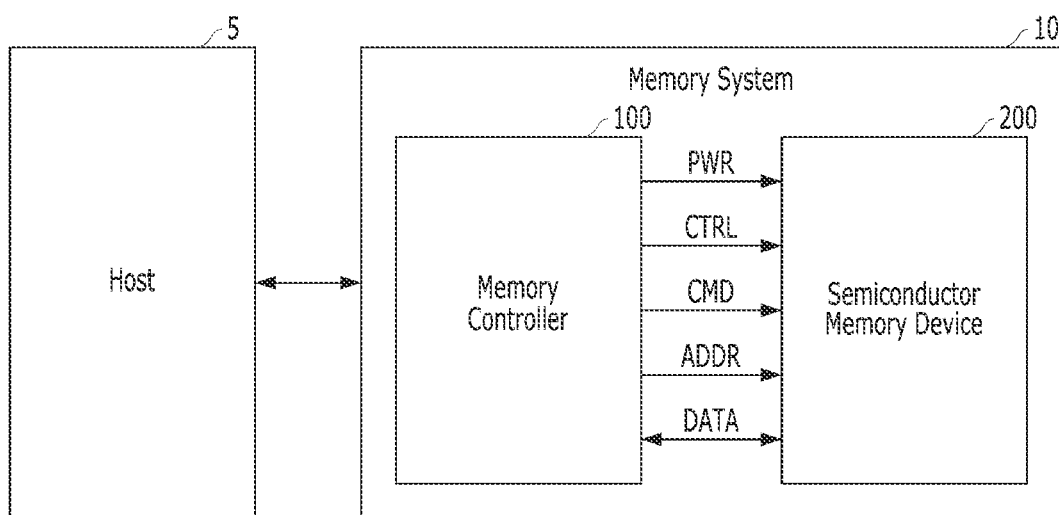
FIG. 1 is a block diagram illustrating a data processing system.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
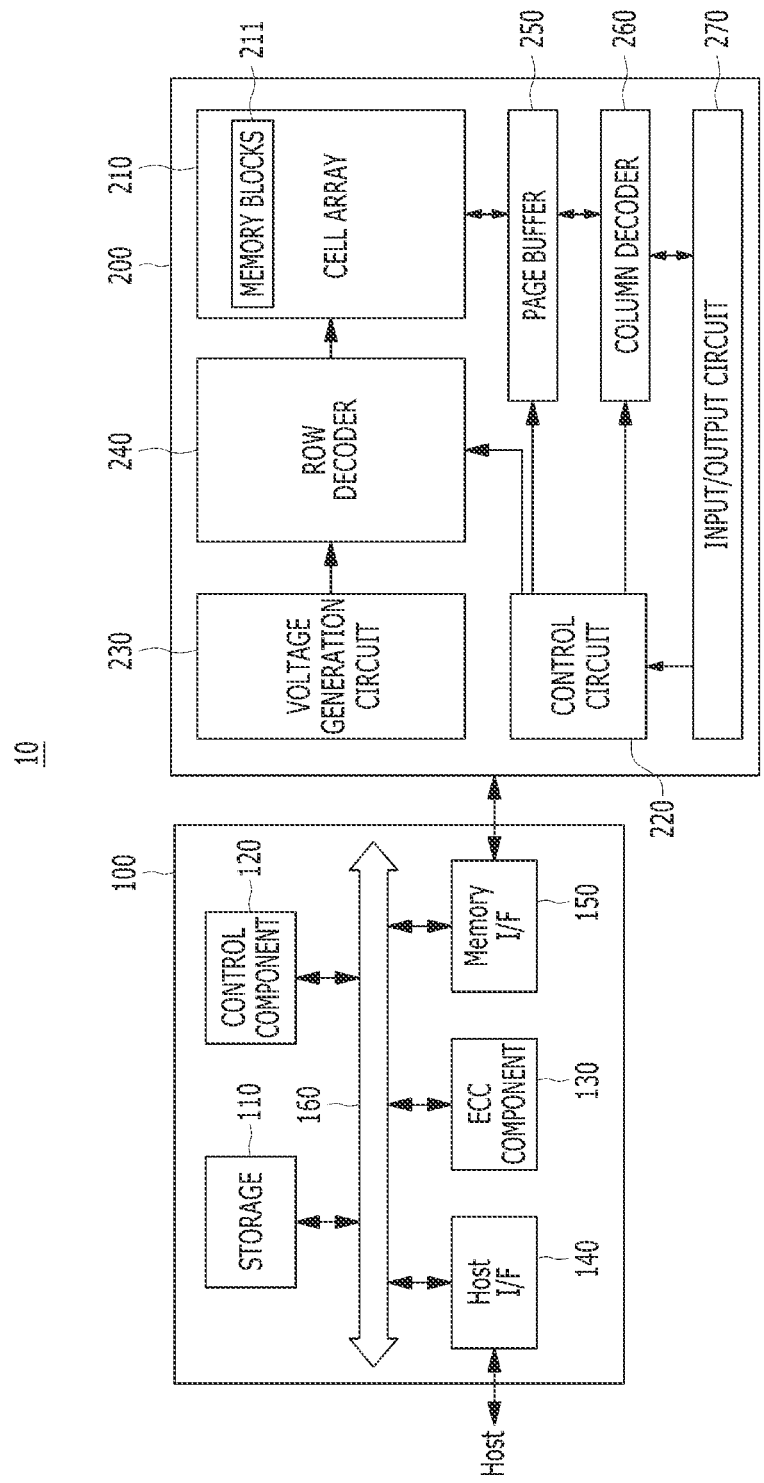
FIG. 2 is a block diagram illustrating a memory system.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
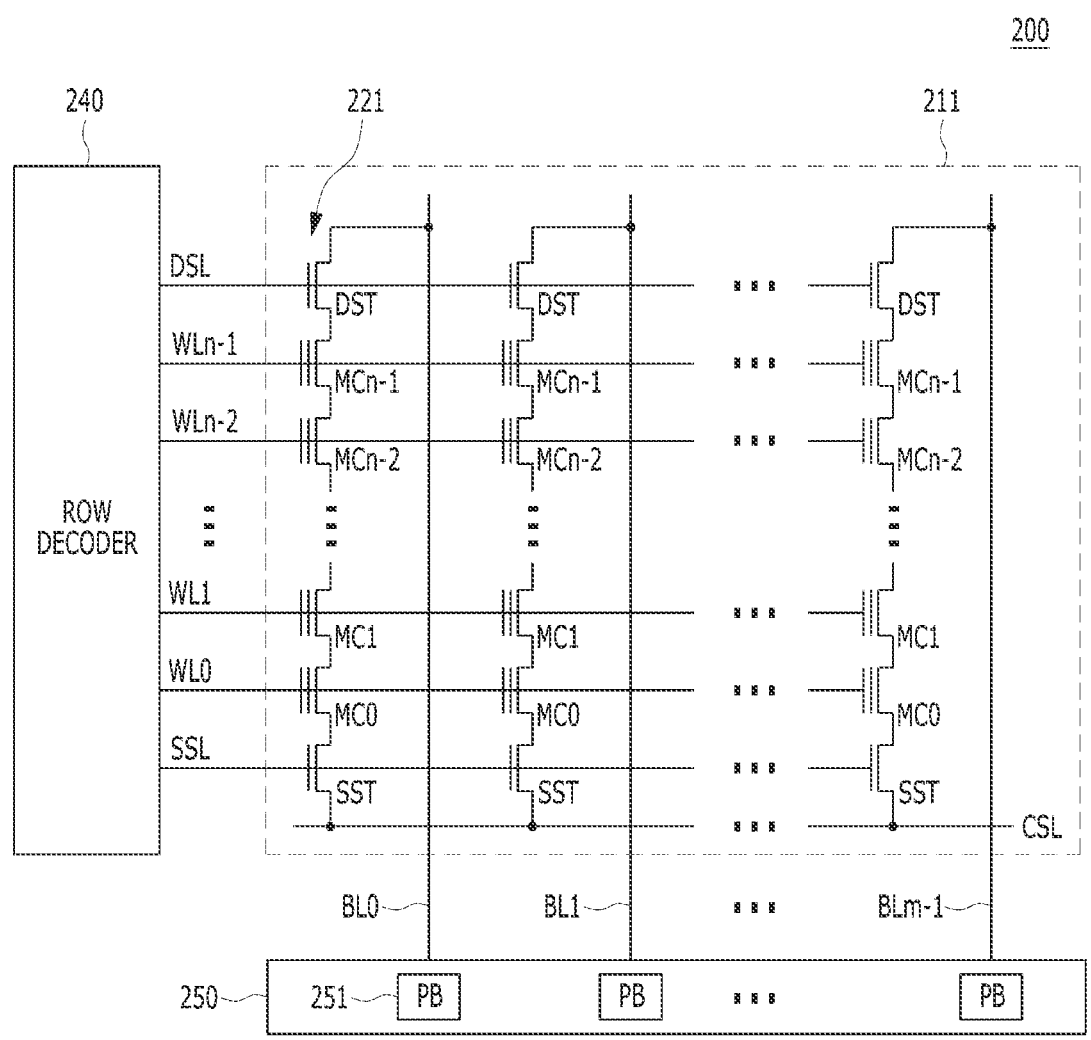
FIG. 3 is a circuit diagram illustrating a memory block of a memory device.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
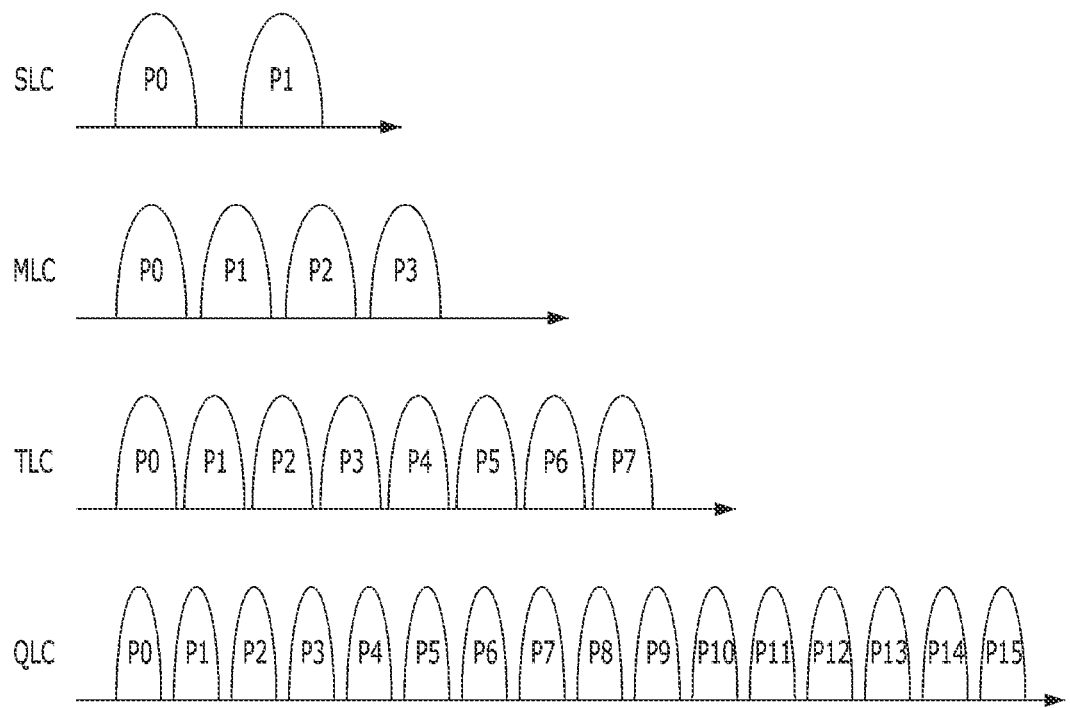
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

Figure 5A:
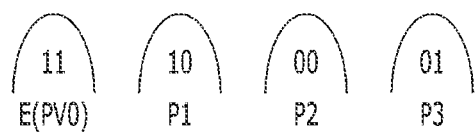
FIG. 5A is a diagram illustrating an example of Gray coding for a multi-level cell (MLC).

FIG. 5A is a diagram illustrating an example of coding for a multi-level cell (MLC).

Referring to FIG. 5A, an MLC may be programmed using a set type of coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
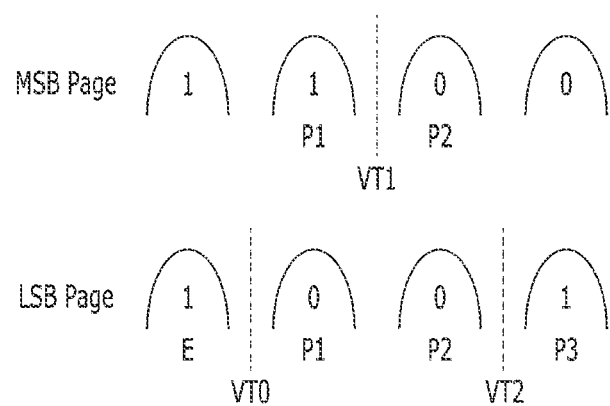
FIG. 5B is a diagram illustrating state distributions for pages of a multi-level cell (MLC).

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, 2 thresholds include a threshold value VT0 and a threshold value VT2. VT0 distinguishes between the erased state E and the first program state PV1. VT2 distinguishes between the second program state PV2 and the third program state PV3.

Figure 6A:
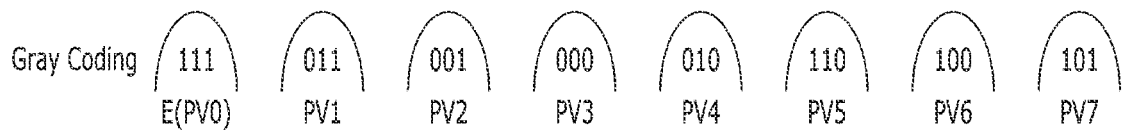
FIG. 6A is a diagram illustrating an example of Gray coding for a triple-level cell (TLC).

FIG. 6A is a diagram illustrating an example of Gray coding for a triple-level cell (TLC).

Referring to FIG. 6A, a TLC may be programmed using Gray coding. A TLC may have 8 program states, which include an erased state E (or PV0) and a first program state PV1 to a seventh program state PV7. The erased state E (or PV0) may correspond to "111." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 6B:
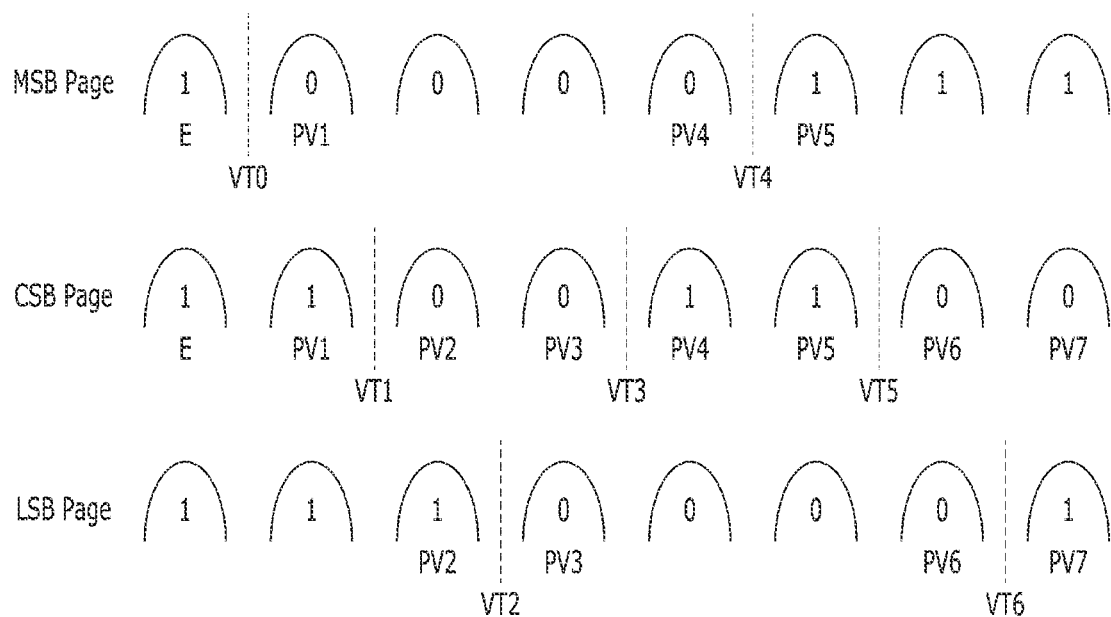
FIG. 6B is a diagram illustrating state distributions for pages of a triple-level cell (TLC).

In the TLC, as shown in FIG. 6B, there are 3 types of pages including LSB, CSB and MSB pages. 2 or 3 thresholds may be applied in order to retrieve data from the TLC. For an MSB page, 2 thresholds include a threshold value VT0 that distinguishes between an erase state E and a first program state PV1 and a threshold value VT4 that distinguishes between a fourth program state PV4 and a fifth program state PV5. For a CSB page, 3 thresholds include VT1, VT3 and VT5. VT1 distinguishes between a first program state PV1 and a second program state PV2. VT3 distinguishes between a third program state PV3 and the fourth program state PV4. VT5 distinguishes between the fourth program state PV5 and the sixth program state PV6. For an LSB page, 2 thresholds include VT2 and VT6. VT2 distinguishes between the second program state PV2 and the third program state PV3. VT6 distinguishes between the sixth program state PV6 and a seventh program state PV7.

After a memory array including a plurality of memory cells is programmed as described in FIGS. 5A and 6A, when a read operation 20 is performed on the memory array using a certain reference voltage such as a read threshold voltage (also called "read voltage level" or "read threshold"), the electrical charge levels of the memory cells (e.g., threshold voltage levels of transistors of memory cells) are compared to one or more reference voltages to determine the state of individual memory cells. When a certain read threshold is applied to the memory array, those memory cells that have threshold voltage levels higher than the reference voltage are turned on and detected as "on" cells, whereas those memory cells that have threshold voltage levels lower than the reference voltage are turned off and detected as "off" cells, for example. Therefore, each read threshold is arranged between neighboring threshold voltage distribution windows corresponding to different programmed states so that each read threshold can distinguish such programmed states by turning on or off the memory cell transistors.

When a read operation is performed on memory cells in a data storage device using MLC technology, the threshold voltage levels of the memory cells are compared to more than one read threshold level to determine the state of individual memory cells. Read errors can be caused by distorted or overlapped threshold voltage distributions. An ideal memory cell threshold voltage distribution can be significantly distorted or overlapped due to, e.g., program and erase (P/E) cycles, cell-to-cell interference, and/or data retention errors. For example, as program/erase cycles increase, the margin between neighboring threshold voltage distributions of different programmed states decreases and eventually the distributions overlap. As a result, the memory cells with threshold voltages that fall within the overlapping region of the neighboring distributions may be read as being programmed to a value other than the original targeted value and thus cause read errors. Such read errors may be managed in most situations by using error correction codes (ECC). When the number of bit errors on a read operation exceeds the ECC correction capability of the data storage, the read operation fails. When the read operation failed, the controller 120 may control an error recovery algorithm as shown in FIG. 7.

Figure 7:
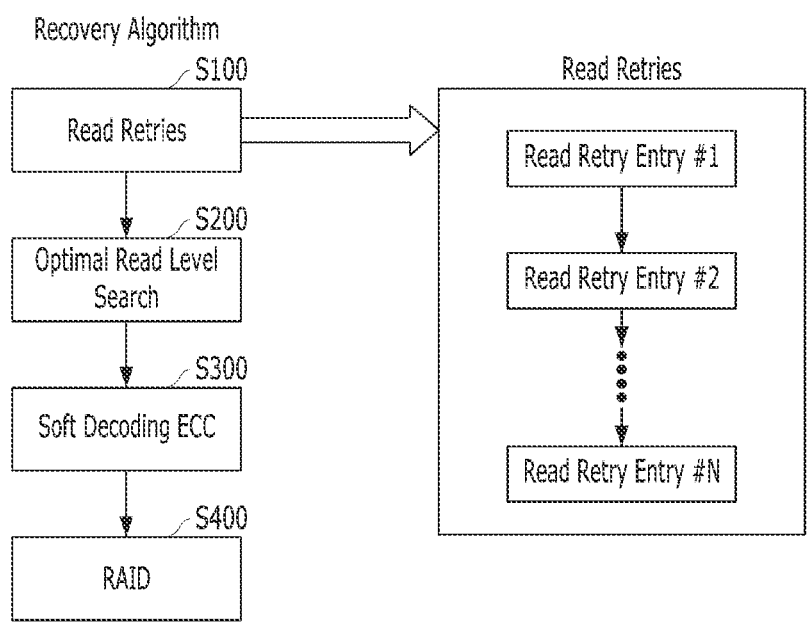
FIG. 7 is a diagram illustrating a flow of an error recovery algorithm in a memory system.

Referring to FIG. 7, the controller 120 may perform one or more read retry operations for the memory cells using one or more read threshold voltages applied in a set order (S100). For example, the read threshold voltages may include N (e.g., N is 50) read threshold voltages (or read voltage levels) including a first read threshold voltage to an Nth read threshold voltage. The first read threshold voltage may be a previously used read threshold voltage (i.e., history read threshold voltage). The history read threshold voltage may be the read threshold voltage used in the last successful decoding, that is, a read voltage used in a read-passed read operation performed before the read retry operations. The controller 120 may perform the read retry operations until it is determined that decoding associated with a corresponding read retry operation is successful.

When all read retry operations using the read threshold voltages failed, the controller 120 may perform additional recovery operations. For example, the additional recovery operations may include an optimal read threshold voltage search (S200), a soft decoding using an error correction code (ECC) (S300) and a redundant array of independent disks (RAID) recovery (S400).

In memory systems such as NAND-based storage systems, if a few read attempts for a particular page are unsuccessful, attempting more reads for the page will not work. However, in order to meet the quality of service (QoS) requirements for memory systems (e.g., enterprise solid state drives (SSDs)), it is necessary to read data of a page with the number of bit errors less than an error correction capability of an error correction code (ECC) scheme used in decoding read data. Further, a single read operation may have long latency (e.g., 60 us or longer). Accordingly, it is desirable to provide a scheme for determining a read retry threshold voltage that does not cause an unreasonably large number of bit errors within a small latency.

Embodiments provide a scheme to adaptively determine a read retry threshold voltage for a next read operation using meta information collected from data of previous failed read attempts, and perform a read retry operation using the adaptive read retry threshold voltage. This scheme may be called "an adaptive read retry (RR) scheme." The adaptive RR scheme i) adapts cell-level distribution of any failed page, ii) does not depend on NAND condition information (e.g., PEC, SPRD, etc.) utilized in history read and other read mechanisms, and iii) does not depend on NAND generation. The performance of the adaptive RR scheme may depend on the number of previous reads available and the quality of meta information provided by the previous failed read attempts.

Figure 8:
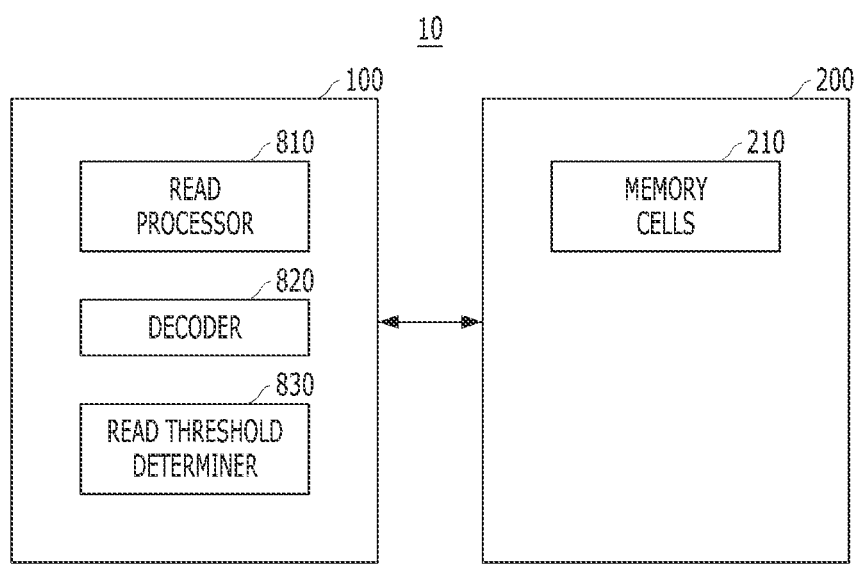
FIG. 8 is a diagram illustrating a memory system in accordance with an embodiment of the present invention.

FIG. 8 is a diagram illustrating a memory system 10 in accordance with an embodiment of the present invention.

Referring to FIG. 8, the memory system 10 may include a controller 100 and a memory device 200. The memory device 200 may include a plurality of memory cells (e.g., NAND flash memory cells) 210. The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

The controller 100 may include a read processor 810, a decoder 820 and a read threshold determiner 830. Although it is illustrated that components of the controller 100 are implemented separately, these components may be integrated into a single component (i.e., firmware (FW)) of the controller 100 or the control component 120 in FIG. 2. Although not shown in FIG. 8, the controller 100 and the memory device 200 may include various other components as shown in FIG. 2.

The read processor 810 may control one or more read operations performed on the memory device 200 in response to a read request from a host (e.g., the host 5 of FIG. 1). The read processor 810 may control the read operations using various read thresholds. The decoder 820 may decode data associated with the read operations.

In some embodiments, the read processor 810 may control a read operation on memory cells using a read threshold selected from a set read level table. In some embodiments, the read level table may include multiple read thresholds, one of which is a default read threshold. When a read operation is performed on an MSB page of TLC, a pair of first and second read thresholds [VT0, VT4] may be selected as shown in FIG. 6B. The first read threshold value VT0 is used to distinguish between an erase state (i.e., E) and a first program state (i.e., PV1), and the second read threshold value VT4 is used to distinguish between a fourth program state (i.e., PV4) and a fifth program state (i.e., PV5). When the read operation is performed on an LSB page of TLC, a pair of first and second read thresholds [VT2, VT6] may be selected as shown in FIG. 6B. The first read threshold value VT2 is used to distinguish between a second program state (i.e., PV2) and a third program state (i.e., PV3), and the second read threshold value VT6 is used to distinguish between a sixth program state (i.e., PV6) and a seventh program state (i.e., PV7).

It may be determined whether the read operation using one or more read thresholds selected from a read threshold set succeeded or failed, depending on the decoding result of the decoder 820. When the read operation using the selected read threshold(s) failed, the read processor 810 may control performance of one or more read retry operations on the memory cells using read retry voltages (read retry entries), as shown in FIG. 7.

The read threshold determiner 830 may estimate a read threshold voltage Vt through P1 estimation and CS estimation.

Figure 12A:
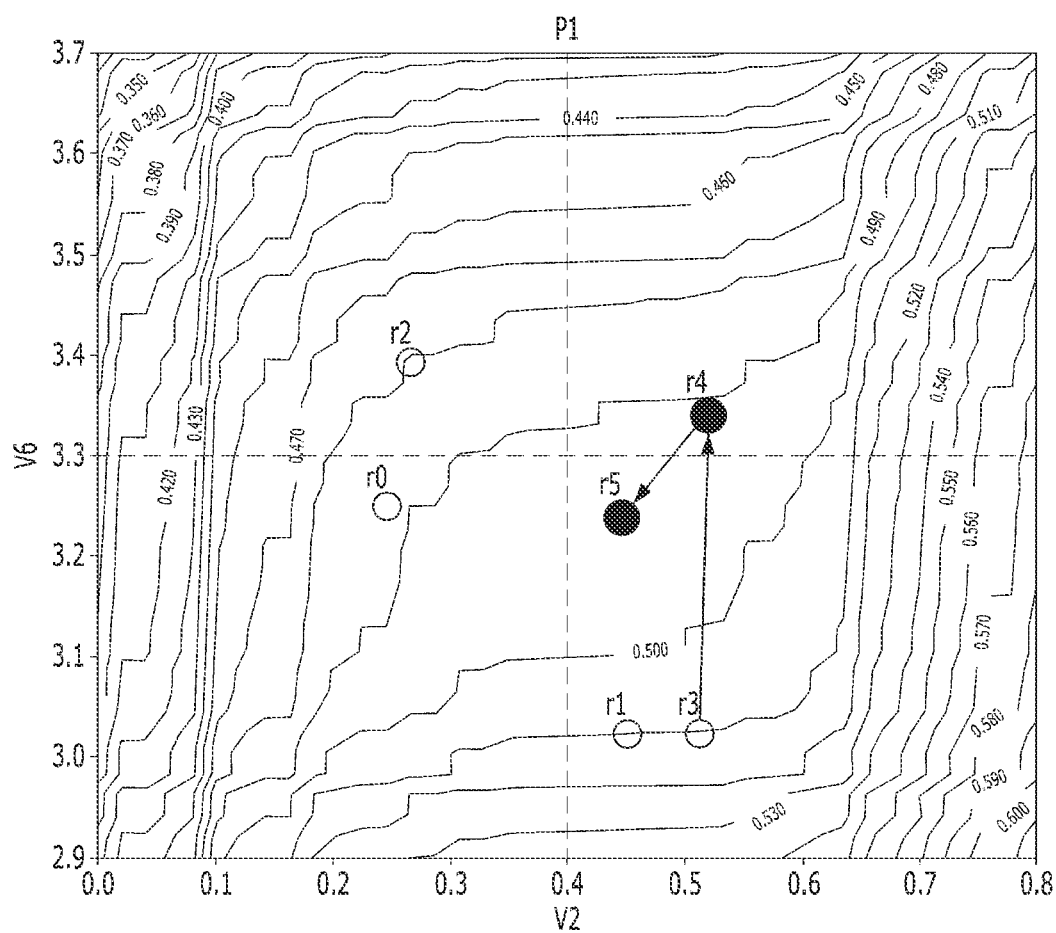
FIGS. 12A and 12D illustrate examples of an operation for determining a read retry threshold voltage in accordance with an embodiment of the present invention.
Figure 12B:
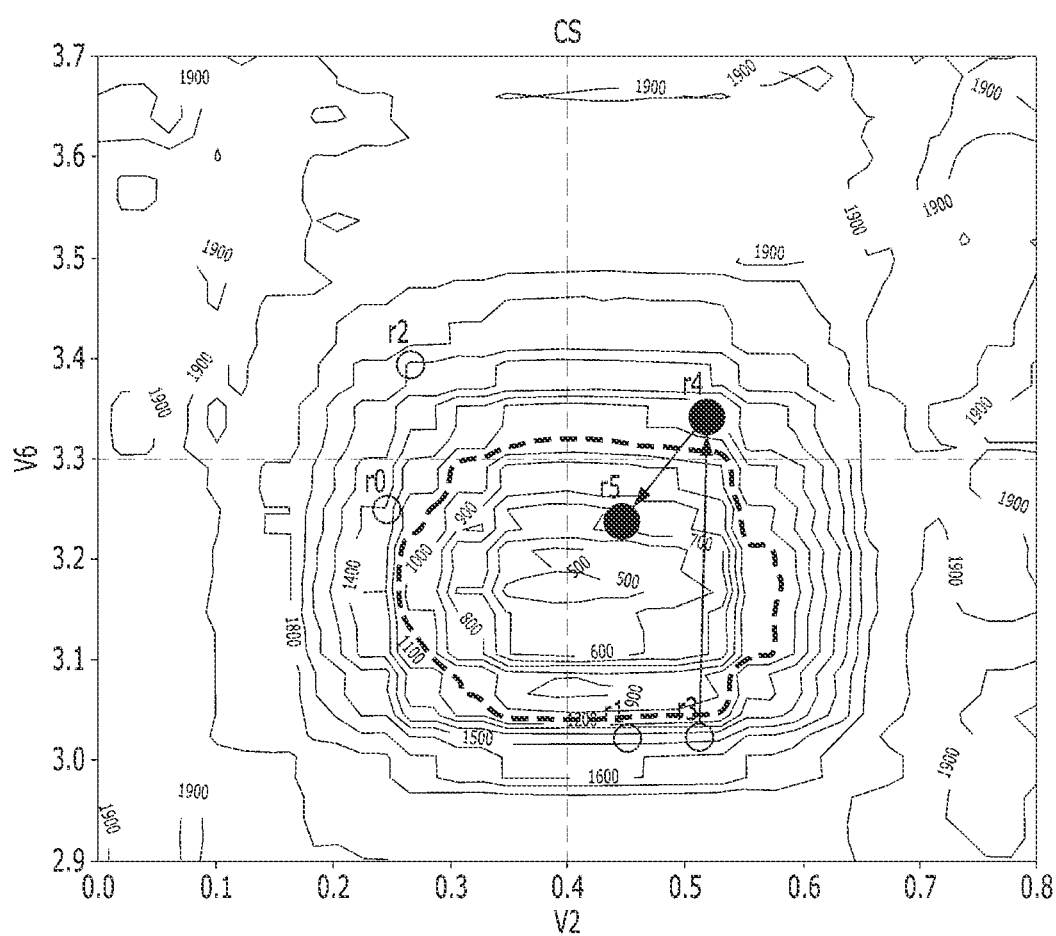

For P1 estimation, the read threshold determiner 830 may obtain meta information associated with read operations performed on a select page among the plurality of pages, the meta information including, for a given read operation, multiple read threshold voltages, i.e., (a read threshold voltage set), a checksum value and percentage of bits of a particular value, i.e., 0's or 1's, in data associated with the read operation. The read threshold determiner 830 may determine a mathematical model for estimating a percentage of bits of the particular value in data associated with a next read operation, using a set function of the read threshold voltage set used for a current read operation. The read threshold determiner 830 may determine a set of parameters by performing linear regression on the mathematical model. The read threshold determiner 830 may determine a best previous read threshold voltage set among multiple read threshold voltage sets for multiple past reads, based on the multiple checksum values. The read threshold determiner 830 may determine a point corresponding to the best pervious read threshold voltage set on a surface defined by the voltages of that set. In some embodiments, a surface for LSB page of TLC may be formed by a set [VT2, VT6] of the multiple read threshold voltage sets (e.g., VT0 to VT7), as shown in FIGS. 12A and 12B. The read threshold determiner 830 may determine a line on the surface pointing to a next read threshold voltage for the next read operation based on the set of parameters.

For CS estimation, the read threshold determiner 830 may obtain meta information associated with a read operation on a select page among the plurality of pages, the meta information including a read threshold voltage set which is associated with the read operation. The read threshold determiner 830 may determine a mathematical model for estimating a checksum value of data associated with a next read operation, using a set function of the read threshold voltage set and a maximum possible checksum value. The read threshold determiner 830 may determine a set of parameters by performing polynomial regression on the mathematical model. The read threshold determiner 830 may estimate a next read threshold voltage for the next read operation based on the set of parameters.

Further, the read threshold determiner 830 may determine whether estimated read threshold voltages are valid. In some embodiments, the read threshold determiner 830 may determine whether estimated next read threshold voltages are within a set threshold range.

When it is determined that at least one of the estimated read threshold voltages is valid (Pass), the read threshold determiner 830 may determine all of the estimated read threshold voltages, or only the estimated read threshold voltage determined to be valid, as a new read threshold voltage V (for a next read operation.

When it is determined that all of the estimated read threshold voltages are invalid (Fail), the read threshold determiner 830 may perform an exploratory read to estimate a new read threshold voltage $V^{(n)}$ for a next read operation. In some embodiments, the read threshold determiner 830 may divide the set threshold range into multiple zones when it is determined that none of the estimated read threshold voltages are within the set threshold range. The read threshold determiner 830 may find a zone with the lowest number of previous read threshold voltages, among the multiple zones. The read threshold determiner 830 may randomly determine, as the new read threshold voltage $V^{(n)}$, any read threshold voltage in the zone.

Figure 9:
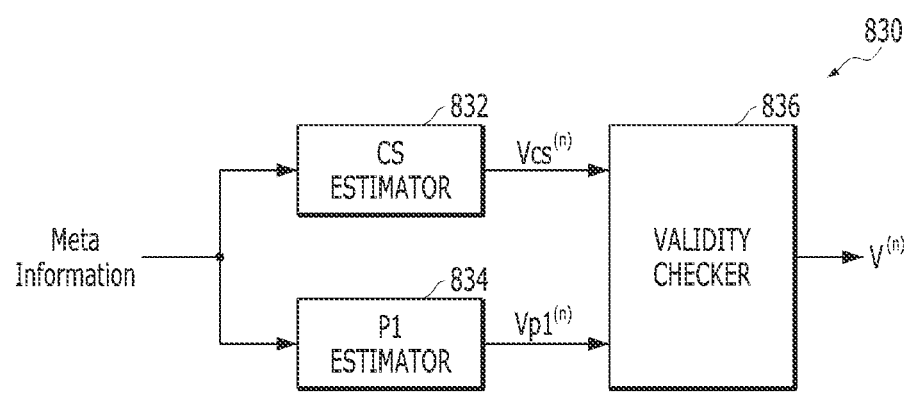
FIG. 9 is a diagram illustrating a read threshold determiner in accordance with an embodiment of the present invention.

FIG. 9 is a diagram illustrating a read threshold determiner 830 in accordance with an embodiment of the present invention.

Referring to FIG. 9, for the adaptive RR scheme, the read threshold determiner 830 may use and process meta information to determine and output a read threshold voltage $V^{(n)}$ for a next read operation. In some embodiments, the meta information may be collected from the decoder 820 even when reads are not successful, i.e., read data not successfully decoded. The meta information for CS estimation and P1 estimation, as described above, may be used. The meta information is input to each of a CS estimator 832 and a P1 estimator 834. For an LSB page of TLC memory cells, the meta information includes read threshold voltages ($v_2$, $v_6$) or (VT2, VT6) in FIG. 6B, and percentage of 1's (i.e., $P_1$) in read data or the decoding result of the read data. For a page written with randomized data, $P_1$ is close to 50%, and a checksum represents an initial syndrome weight of a codeword (e.g., a low density parity check (LDPC) codeword) corresponding to the decoding result of read data. Although features of the invention are described in the context of an LSB page of TLC memory cells, such features may be applied to any page of various memory cells, e.g., MSB or CSB pages of TLC memory cells, or MSB, CMSB, CLSB or LSB pages of QLC memory cells.

Figure 10A:
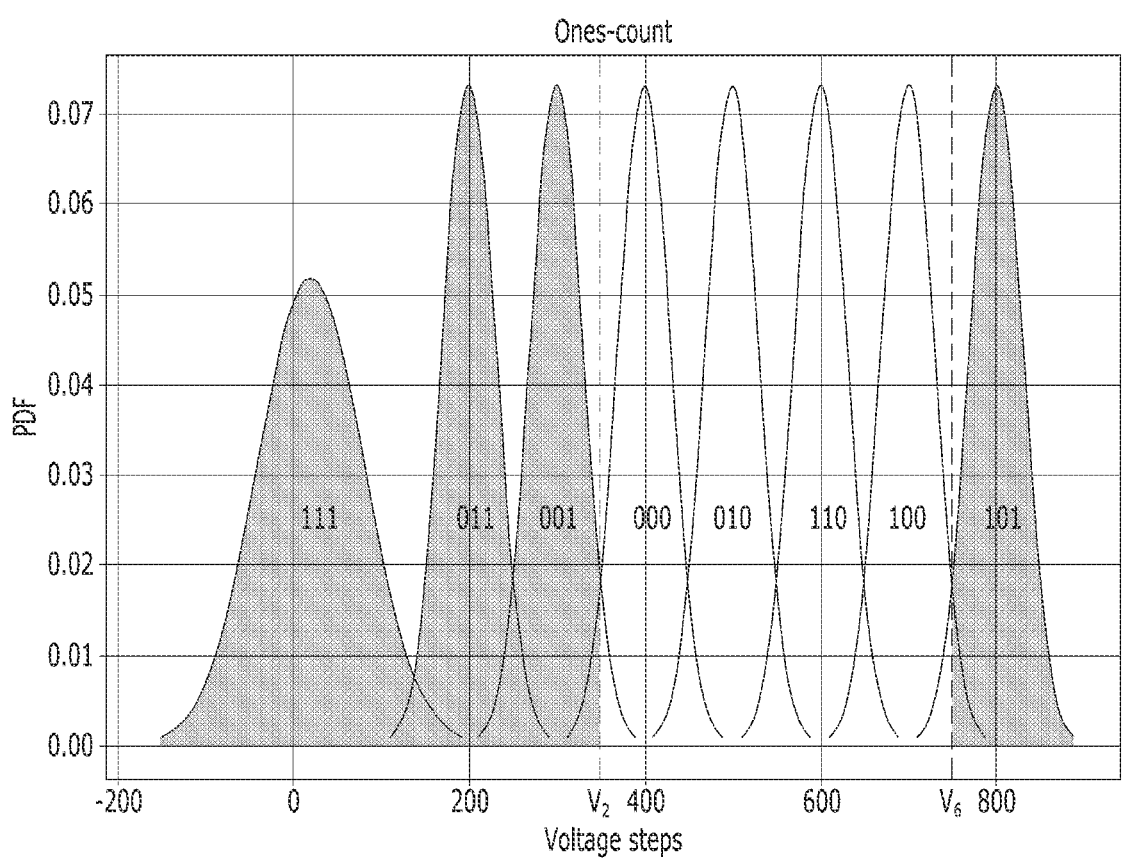
FIGS. 10A and 10B are diagrams illustrating meta information in accordance with an embodiment of the present invention.
Figure 10B:
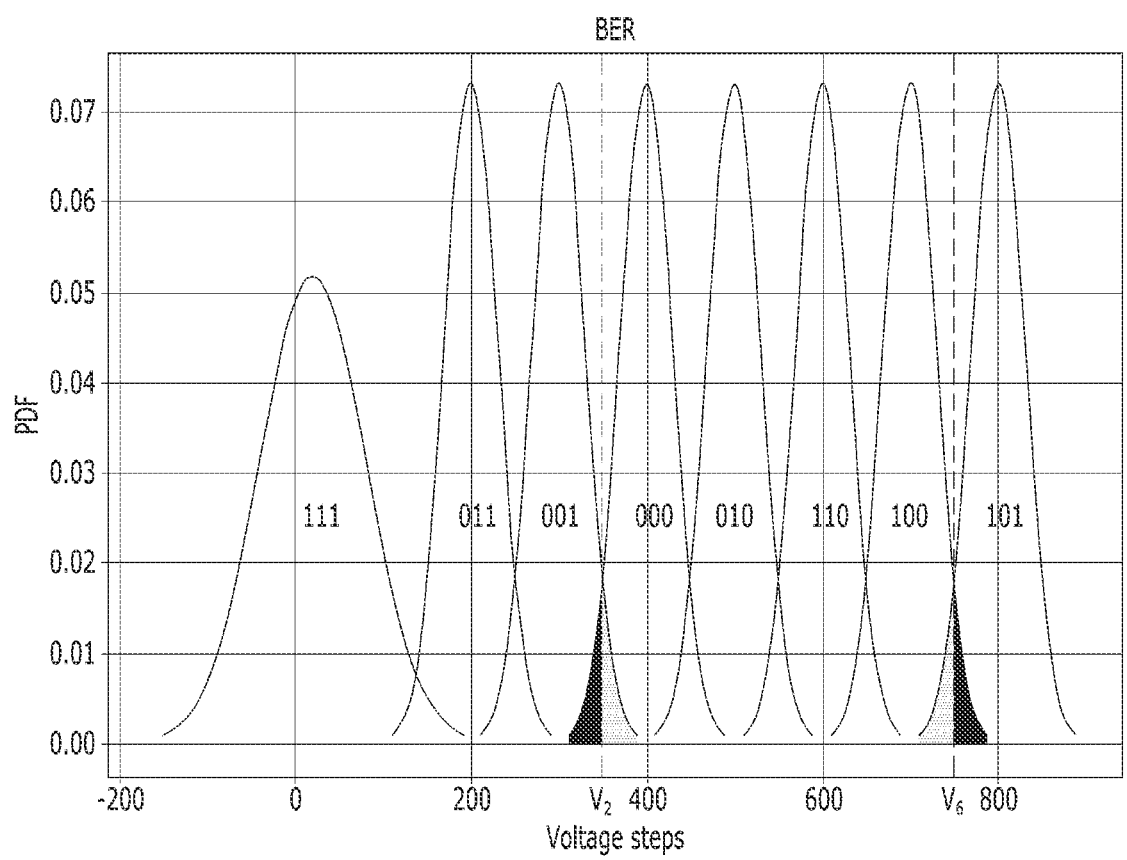

FIGS. 10A and 10B are diagrams illustrating meta information with respect to TLC memory cell-level distribution in accordance with an embodiment of the present invention. In FIGS. 10A and 10B, the horizontal axis (i.e., x-axis) represents read threshold voltages and the vertical axis (i.e., y-axis) represents a distribution, i.e., probability density function (PDF) for programmed TLC memory cells.

Referring to FIG. 10A, when an LSB page of TLC memory cells is programmed with randomized data, $P_1$ (percentage of 1's) is close to 50% in the shaded portions.

Ideally, if these distributions are disjoint, error-free data can be recovered by applying read thresholds. However, these distributions may be crossing or overlapped each other. In this case, by applying a read (e.g., V2 & V6 for LSB page), some information can be observed even if decoding is not successful. In FIG. 10A, shaded portions show the probability of observing a binary value of 1. The shaded portions in FIG. 10B show the probability of read failure. After each read, the number of cells that are read as one can be found. However, the probability of the read failure cannot be observed. Instead, checksum which is a mapping of the probability of the read failure can be observed.

Referring to FIG. 10B, checksum or syndrome weight of a codeword of the decoding result of read data may be used to estimate a bit error rate (BER), i.e., read failure.

Referring back to FIG. 9, the read threshold determiner 830 may receive meta information associated with previous failed read data as input. In some embodiments, the meta information may include information $V_r$ and $O_r$, which are collected from the read processor 810 and/or the decoder 820 in FIG. 8. $V_r = \{(v_2^{(k)}, v_6^{(k)}), 1 \leq k \leq m\}$ may be the set of previous read thresholds (i.e., failed reads) for the LSB page of TLC memory cells. $O_r = \{(cs^{(k)}, p_1^{(k)}), 1 \leq k \leq m\}$ may be the set of observations CS, $P_1$, which are obtained from applying $V_r$. CS represents a checksum value and $P_1$ representing the percentage of 1's in decoded data.

The CS estimator 832 may estimate the checksum value $\widehat{CS}$ for a next potential read threshold voltage to be used for a next read operation. $\widehat{CS}$ means the estimated checksum (CS). Although the actual CS value may be obtained after each read operation, the CS estimator 832 may estimate a checksum value using a mathematical model. The CS estimator 832 may find $\widehat{CS}$ such that it is as close to CS as possible. In some embodiments, the CS estimator 832 may estimate the checksum value for the next potential read threshold voltage using a mathematical model (i.e., a quadratic model) as shown in Equation (1):

$$\widehat{CS} = cs_{max} \times S(\theta_0 + \theta_1 v_2 + \theta_2 v_2^2 + \theta_3 v_6 + \theta_4 v_6^2) \quad (1)$$

In Equation (1), $S(\bullet)$ denotes a sigmoid function, $cs_{max}$ represents the largest possible checksum value, and ($v_2$, $v_6$) represents the set of previous read thresholds for the LSB page of TLC memory cells. $CS_{max}$ may be the size of syndrome or the number of rows in a parity check matrix, which are associated with decoding of read data. In some embodiments, when the number of rows in the parity check matrix is m, $CS_{max}$ may be determined to be m/2. In other embodiments, $CS_{max}$ may be determined to be m.

The CS estimator 832 may find a set of parameters $\theta$s using Equation (1) and may provide a set of read threshold voltages that minimizes $\widehat{CS}$. One of the read threshold voltages in the provided set may serve as the next potential read threshold voltage. For this, from Equation (1), the CS estimator 832 may derive Equation (2) below:

$$\theta_0 + \theta_1 v_2 + \theta_2 v_2^2 + \theta_3 v_6 + \theta_4 v_6^2 = S^{-1}\left(\frac{\widehat{CS}}{cs_{max}}\right) \quad (2)$$

Next, the CS estimator 832 may perform polynomial regression on Equation (2) to obtain the set of parameters $\theta s = \{\theta_0, \theta_1, \ldots, \theta_4\}$.

Finally, the CS estimator 832 may compute a set of read threshold voltages, one of which may be used as the next read threshold voltage based on the set of parameters, as shown in Equation (3) below:

$$V_{cs}^{(n)} = \arg\min_{(v_2, v_6)} \widehat{CS} = \left(-\frac{\theta_1}{2 \cdot \theta_2}, -\frac{\theta_3}{2 \cdot \theta_4}\right) \quad (3)$$

As described above, in order to optimize $\widehat{CS}$, the CS estimator 832 may make the partial derivative of $\widehat{CS}$ with respect to $v_2$ and $v_6$ equal to 0, and then find the result.

The P1 estimator 834 may estimate the percentage of 1's in data associated with a next potential read threshold voltage to be used for a next read operation, using a mathematical model (i.e., a linear model) as shown in Equation (4) below:

$$\hat{P} = S(\phi_0 + \phi_1 v_2 + \phi_2 v_6) \quad (4)$$

The P1 estimator 834 may find a set of parameters $\phi$s using Equation (4) and may provide a set of read threshold voltages that maps the best previous read on a set line of a surface (e.g., a surface of coordinates in FIG. 12A) formed by read threshold voltages, each of which a potential read threshold voltage for the next read operation. For this operation, from Equation (4), the P1 estimator 834 may derive Equation (5) below:

$$\phi_0 + \phi_1 v_2 + \phi_2 v_6 = S^{-1}(\hat{P}_1) \quad (5)$$

Next, the P1 estimator 834 may perform linear regression on Equation (5) to obtain the set of parameters $\phi s = \{\phi_0, \phi_1, \phi_2\}$.

Then, the P1 estimator 834 may find the index of the best previous read through Equation $$k^* = \arg\min_{1 \leq k \leq m} cs^{(k)}. \qquad 5$$

Finally, the P1 estimator 834 may compute the next potential read threshold voltage based on the set of parameters, as shown in Equation (6) below:

$$V_{p_1}^{(n)} = \text{Project point } (v_2^{(k^*)}, v_6^{k^*}) \text{ on line } (\phi_0 + \phi_1 v_2 + \phi_2 v_6 = 0) \qquad (6)$$

In Equation (6), "line" means a line in a 2-dimensional space of ($v_2$, $v_6$).

In the read process, the target is for P1 to be as close as possible to 0.5. Therefore, the P1 estimator 834 may select the threshold voltage that gives $\hat{P}_1 = 0.5$. From the equation (4) above, $\hat{P}_1 = 0.5$ and $\phi_0 + \phi_1 v_2 + \phi_2 v_6 = 0$ may be derived. In other words, the P1 estimator 834 may indicate that any point on line ($\phi_0 + \phi_1 v_2 + \phi_2 v_6 = 0$) has approximately the same number of ones and zeros (P1=50%).

The P1 estimator 834 may select only one point as the next read threshold voltage among those provided by P1. In other words, the P1 estimator 834 may find the point on the line ($\phi_0 + \phi_1 v_2 + \phi_2 v_6 = 0$) as the best previous read threshold voltage. The best previous read threshold voltage may be the one with the lowest checksum as shown in Equation (6) by ($v_2^{k^*}$, $v_6^{k^*}$). To find the point on the line ($\phi_0 + \phi_1 v_2 + \phi_2 v_6 = 0$) as the best previous point ($v_2^{k^*}$, $v_6^{k^*}$), it is necessary to draw another line from the point ($v_2^{k^*}$, $v_6^{k^*}$), which is perpendicular to the line ($\phi_0 + \phi_1 v_2 + \phi_2 v_6 = 0$). The P1 estimator 834 may find the intersection of these two lines as the next suggested read threshold voltage. This operation may be called projecting point ($v_2^{k^*}$, $v_6^{k^*}$) onto the line ($\phi_0 + \phi_1 v_2 + \phi_2 V_6 = 0$).

The suggested (or potential) read threshold voltages $v_{cs}^{(n)}$, $V_{p_1}^{(n)}$ for a next potential read threshold voltage by the estimators 832, 834 may depend on how much data are available in the previous reads. Depending on the previous read data, both or one of the suggested read threshold voltages $V_{cs}^{(n)}$, $V_{p_1}^{(n)}$ might be out of an acceptable threshold range $R_v$. In some embodiments, the acceptable threshold range $R_v$ for the read threshold voltage ($v_2$) to read an LSB page of TLC memory cells may be obtained from the read retry table as $R_v = (R_{v2}^{min}, R_{v2}^{max})$, and the acceptable threshold range $R_v$ for the read threshold voltage ($v_6$) to read the LSB page of TLC memory cells may be obtained from the read retry table as $R_v = (R_{v6}^{min}, R_{v6}^{max})$. Herein, $R_{v2}^{min}$ represents the minimum of all $v_2$ thresholds in the read retry table, $R_{v2}^{max}$ represents the maximum of all $v_2$ threshold in the read retry table, $R_{v6}^{min}$ represents the minimum of all $v_6$ thresholds in the read retry table and $R_{v6}^{max}$ represents the maximum of all $v_6$ threshold in the read retry table.

Bad estimation of potential read threshold voltages $v_{cs}^{(n)}$, $V_{p_1}^{(n)}$ might happen when all previous reads are very close to each other and they do not contain sufficient information to identify the surface or when many previous reads suffer from excessive noise. The validity checker 836 may check whether at least one of the suggested read threshold voltages $V_{cs}^{(n)}$, $V_{p_1}^{(n)}$ is out of the set acceptable threshold range $R_v$. The validity checker 836 may perform the check operation and a corresponding operation based on the check result, as shown in List (1):

---

List (1)

If ($V_{cs}^{(n)} \in R_v$ and $V_{p_1}^{(n)} \in R_v$):

$$V^{(n)} = \frac{(v_{cs}^{(n)} + v_{p_1}^{(n)})}{2}$$

Else If ($V_{cs}^{(n)} \in V_{p_1}^{(n)} \notin R_v$):
$V^{(n)} - V_{cs}^{(n)}$
Else If ($V_{cs}^{(n)} \notin R_v$ and $V_{p_1}^{(n)} \in R_v$):
$V^{(n)} - V_{p_1}^{(n)}$
Else: (Exploratory read module)
 Divide $R_v$ into multiple zones
 Find a zone $z_i^*$ with minimum number of previous reads
 $V^{(n)}$ is a random point in $z_i^*$

---

Referring to List 1, when the suggested read threshold voltages $v_{cs}^{(n)}$, $V_{p_1}^{(n)}$ are not out of the set acceptable threshold range $R_v$, the validity checker 836 may determine an average value of two read threshold voltages as the read threshold voltage for the next read operation. When one of the suggested read threshold voltages $V_{cs}^{(n)}$, $V_{p_1}^{(n)}$ is within the set acceptable threshold range $R_v$, the validity checker 836 may determine the read threshold voltage within the set acceptable threshold range $R_v$ as the read threshold voltage for the next read operation. When both of the suggested read threshold voltages $V_{cs}^{(n)}$, $V_{p_1}^{(n)}$ are out of the set acceptable threshold range $R_v$, the validity checker 836 may control an exploratory read module (not shown) to handle the scenario that both of the suggested read threshold voltages are not reliable. The exploratory read module may divide the set acceptable threshold range $R_v$ into multiple zones and find a zone $z^*_i$ with the lowest number of previous reads among the multiple zones. Then, the validity checker 836 may determine a random point in the zone $z^*_i$ as the read threshold voltage for the next read operation. An out of bounds check or another similar heuristic may be used for checking the set acceptable threshold range $R_v$.

In some embodiments, the validity checker 836 may divide the acceptable threshold range $R_v$ into 4 zones Zone1 to Zone4. For example, in the case of $R_v = (R_{v2}^{min}, R_{v2}^{max}, R_{v6}^{min}, R_{v6}^{max})$, each of the zones Zone1 to Zone4 may have the ranges as shown in List (2):

---

List (2)

< Zone1 >
$R_{v2}^{min} \leq v_2 < (R_{v2}^{min} + R_{v2}^{max})/2$, $R_{v6}^{min} \leq v_6 < (R_{v6}^{min} + R_{v6}^{max})/2$
< Zone2 >

$$\frac{R_{v2}^{min} + R_{v2}^{max}}{2} \leq v_2 \leq R_{v2}^{max},$$

$R_{v6}^{min} \leq v_6 < (R_{v6}^{min} + R_{v6}^{max})/2$

< Zone3 >

$R_{v2}^{min} \leq v_2 < (R_{v2}^{min} + R_{v2}^{max})/2$, $\frac{R_{v6}^{min} + R_{v6}^{max}}{2} \leq v_6 \leq R_{v6}^{max}$ < Zone4 >

$$\frac{R_{v2}^{min} + R_{v2}^{max}}{2} \leq v_2 \leq R_{v2}^{max}, \frac{R_{v6}^{min} + R_{v6}^{max}}{2} \leq v_6 \leq R_{v6}^{max}$$

---

Figure 11:
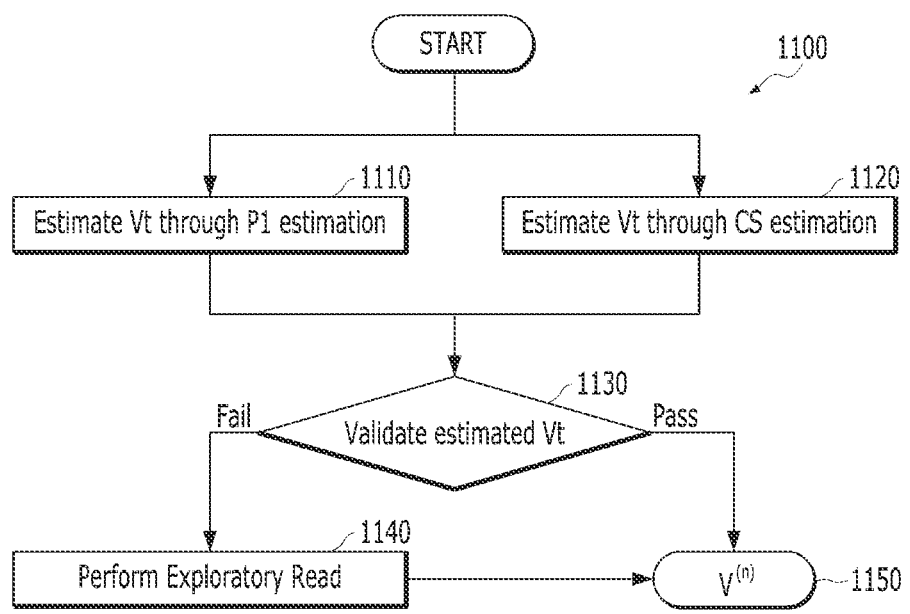
FIG. 11 is a flowchart illustrating an operation for determining a read retry threshold voltage in accordance with an embodiment of the present invention.

FIG. 11 is a flowchart illustrating an operation for determining a read retry threshold voltage in accordance with an embodiment of the present invention. The operation 1100 may be performed by firmware of the controller 100 including the read threshold determiner 830 in FIGS. 8 and 9.

Referring to FIG. 11, at operation 1110, the controller 100 may estimate a read threshold voltage Vt through P1 estimation. In some embodiments, the controller 100 may obtain meta information associated with read operations on a select page among the plurality of pages, as previously described. The controller 100 may determine a mathematical model for estimating the percentage of bits of a specific value, e.g., 1's, of data for a next read operation, using a set function of the read threshold voltage set used for a current read operation. The controller 100 may determine a set of parameters by performing linear regression on the mathematical model. The controller 100 may determine a best previous read threshold voltage set among the multiple read threshold voltage sets, based on the multiple checksum values. The controller 100 may determine a point corresponding to the best previous read threshold voltage set in a surface, which is formed by each set of the multiple read threshold voltage sets. The controller 100 may determine a line of the surface based on the set of parameters. The controller 100 may estimate a next read threshold voltage for the next read operation by projecting the point on the line.

At operation 1120, the controller 100 may estimate a read threshold voltage Vt through CS estimation. In some embodiments, the controller 100 may obtain meta information associated with a read operation on a select page among the plurality of pages, as previously described. The controller 100 may determine a mathematical model for estimating a checksum value for a next read operation, using a set function of the read threshold voltage set and a set checksum value. The controller 100 may determine a set of parameters by performing polynomial regression on the mathematical model. The controller 100 may estimate a next read threshold voltage for the next read operation based on the set of parameters.

At operation 1130, the controller 100 may determine whether estimated read threshold voltages at operations 1110, 1120 are valid. In some embodiments, the controller 100 may determine whether estimated next read threshold voltages are within an acceptable threshold range.

When it is determined that at least one of the estimated read threshold voltages is valid (Pass), the controller 100 may determine both or one of the estimated read threshold voltages as a new read threshold voltage $V^{(n)}$ for a next read operation.

When it is determined that both of the estimated read threshold voltages are invalid (Fail), at operation 1140, the controller 100 may perform an exploratory read to estimate a new read threshold voltage $V^{(n)}$ for a next read operation. In some embodiments, the controller 100 may divide the set threshold range into multiple zones when it is determined that both the first and second next read threshold voltages are not within the acceptable threshold range. The controller 100 may find a zone corresponding to the lowest number of read operations, among the multiple zones. The controller 100 may randomly determine, as the new read threshold voltage $V^{(n)}$, any read threshold voltage in the zone.

Figure 12C:
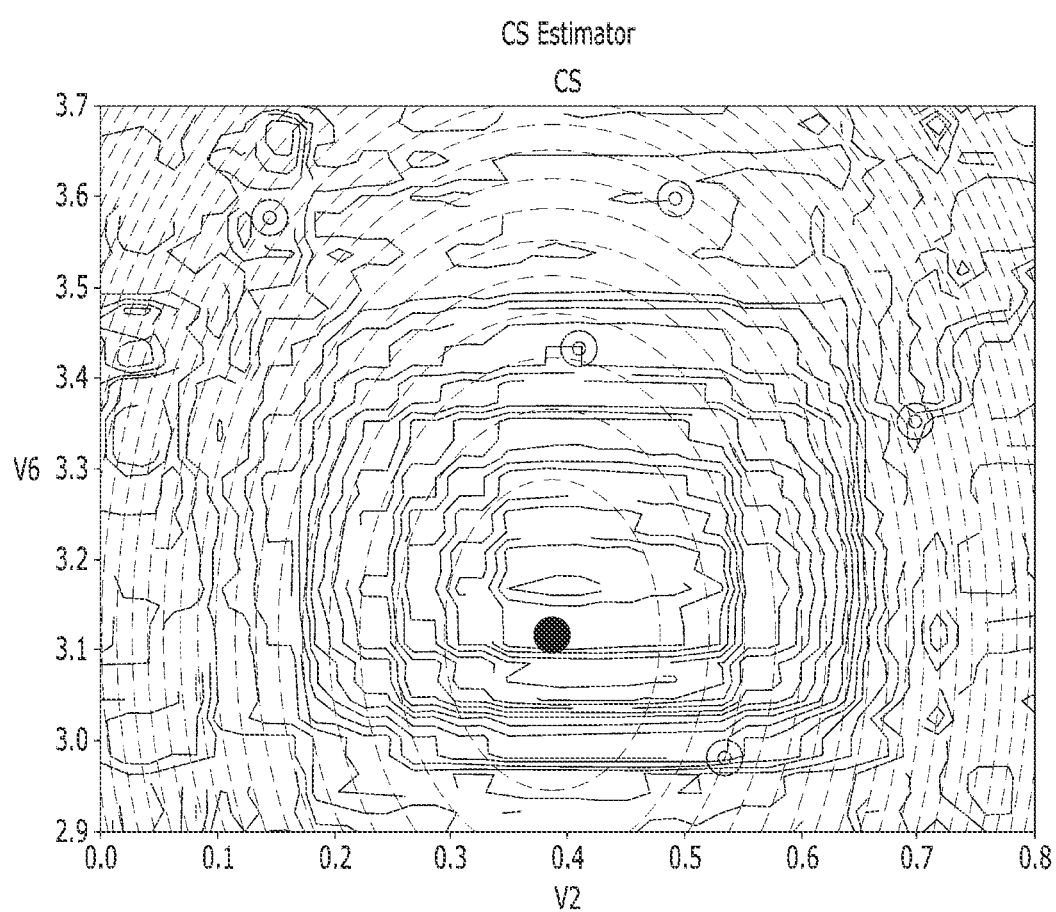
Figure 12D:
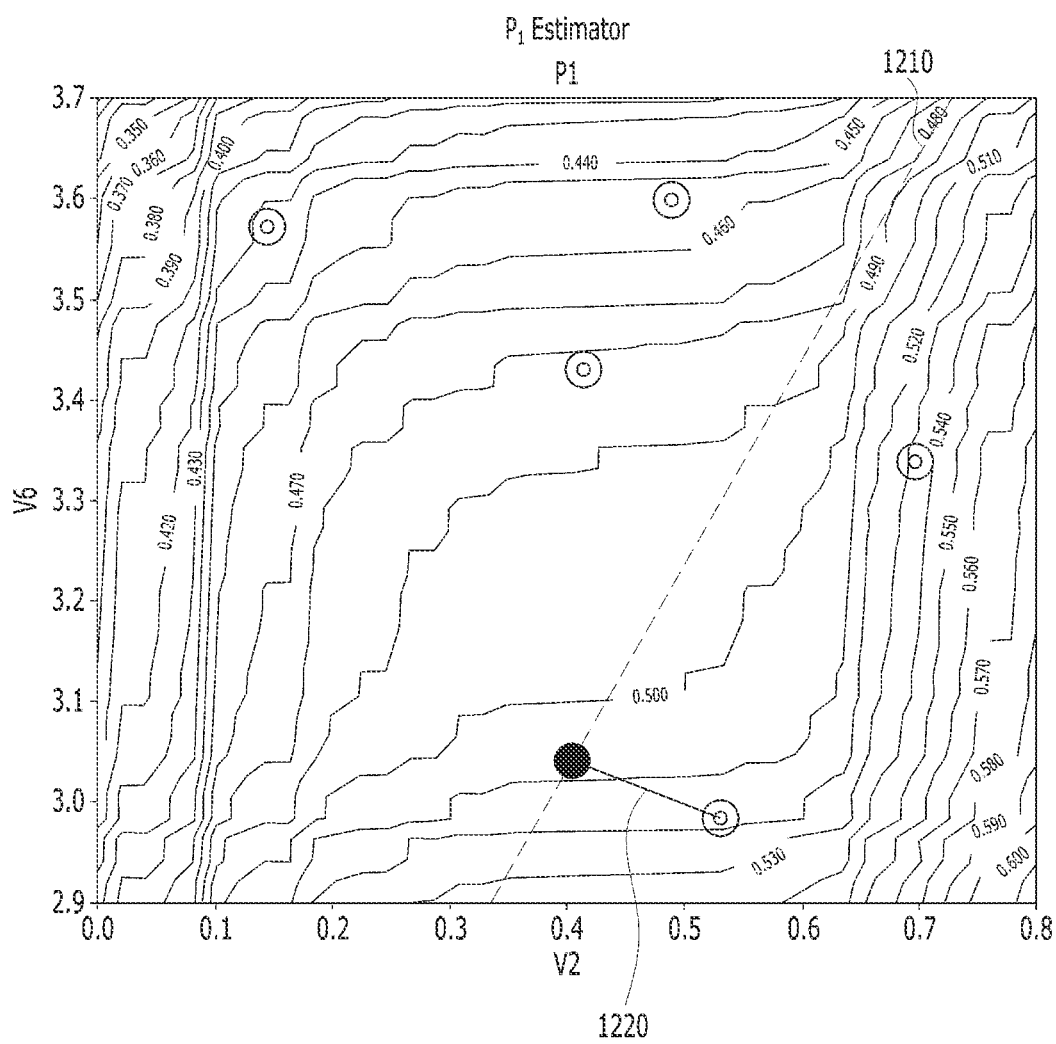

FIGS. 12A and 12D are diagrams illustrating examples of an operation for determining a read retry threshold voltage in accordance with an embodiment of the present invention.

FIGS. 12A and 12B illustrate the final suggested read $r_5$ by the adaptive read retry (RR) and the fact that this suggested read leads to successful decoding.

FIGS. 12C and 12D illustrates the suggested read by the CS estimator 832 and the P1 estimator 834, respectively.

Referring to FIG. 12C, solid contour lines show the contour of actual CS surface, which is actually unknown to the decoder. Symbols "⊚" show the information of previous reads. Dotted contour lines show the estimated CS surface which is obtained by the CS estimator only by looking at the information of symbol "⊚". Dot shows the suggested read by the CS estimator which is the lowest point of the CS surface (see Equation (3)). Dot "●" shows the suggested read which explained in Equation (3).

Referring to FIG. 12D, symbol "⊚" shows the information of previous reads. Solid lines show the actual P1 surface which is unknown to the decoder and adaptive RR model. Dashed line 1210 shows the linear estimation of $P_1=0.5$ (i.e., the line $(\phi_0+\phi_1 v_2+\phi_2 v_6=0)$). Line 1210 is the projection of best previous read (i.e., ⊚ on the line 1210) over the line 1210. Dot "●" shows the suggested read which explained in Equation (6).

The final output of adaptive RR is a combination of dot "●" in FIG. 12C and dot "●" in FIG. 12D.

Figure 13:
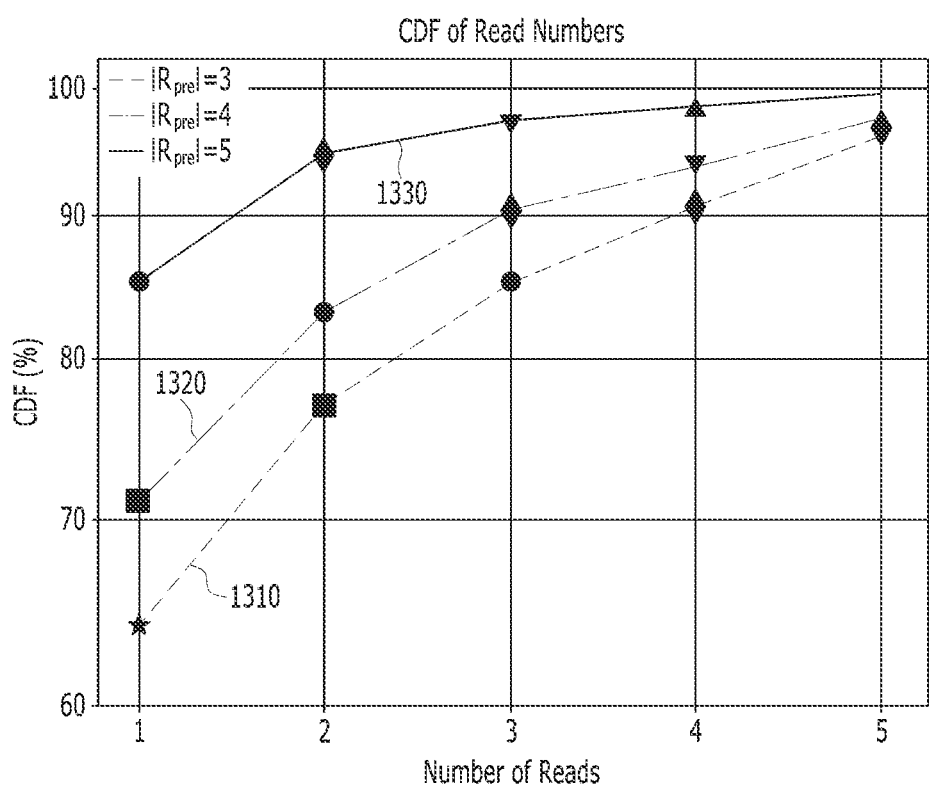
FIG. 13 is a graph illustrating performance of an adaptive read retry operation in accordance with an embodiment of the present invention.

FIG. 13 is a graph illustrating performance of an adaptive read retry (RR) scheme in accordance with an embodiment of the present invention.

Referring to FIG. 13, the horizontal axis (i.e., x-axis) represents the number of reads and the vertical axis (i.e., y-axis) represents a probability for a success rate of read, i.e., cumulative distribution function (CDF) for a success rate of a decoder for decoding read data. The performance of the adaptive read retry scheme depends on the number of previous reads available.

There are three cases, each with a different number of previous reads $|_{Pre}|$: 3, 4 and 5. In the case of three previous reads, i.e., $|R_{Pre}|=3$, when one more read attempt is performed using the read threshold voltage determined through the adaptive RR scheme, the decoder success rate is approximately 65% (1310). In the case of four previous reads, i.e., $|R_{Pre}|=4$, when one more read attempt is performed using the read threshold voltage determined through the adaptive RR scheme, the decoder success rate is approximately 71% (1320). In the case of five previous reads, i.e., $|R_{Pre}|=5$, when one more read attempt using the read threshold voltage determined through the adaptive RR scheme, the decoder success rate is increased to 85% (1330). In the case of $|R_{Pre}|=5$, when two more read attempts using the read threshold voltage determined through the adaptive RR scheme, the decoder success rate is increased to 95% (1330). As mentioned above, the latency of single read may be about 60 us. For those pages that read-retry fails, an algorithm called E-Boost is performed to find the optimal read threshold. Generally, it takes around 500 us (very latent) for the algorithm to suggest a new read. However, inventors observed that embodiments suggest a new read in less than 10 us with the success rate above 75% after two read attempts as shown in FIG. 13. In other words, embodiments reduce the read latency and thus improve quality of service (QoS).

As described above, embodiments provide a scheme for adaptively determining a read retry threshold voltage for a next read operation using meta information collected from previously failed read data. Embodiments may improve quality of service (QoS) requirements provided by the enterprise customers for solid state drives.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device including a plurality of pages; and
   a controller configured to:
   obtain meta information associated with a read operation on a select page among the plurality of pages, the meta information including a read threshold voltage set;
   determine a mathematical model for estimating a checksum value for data associated with a next read operation, using a set function of the read threshold voltage set and a set checksum value;
   determine a set of parameters by performing polynomial regression on the mathematical model; and
   estimate a next read threshold voltage for the next read operation based on the set of parameters.

2. The memory system of claim 1, wherein the set function includes a sigmoid function, and
   wherein the select page includes a least significant bit (LSB) page of a triple-level cell (TLC).

3. The memory system of claim 2, wherein the mathematical model is a quadratic model, which is expressed as:
   $$\widehat{CS} = cs_{max} \times S(\theta_0 + \theta_1 v_2 + \theta_2 v_2^2 + \theta_3 v_6 + \theta_4 v_6^2),$$
   wherein $S(\bullet)$ denotes the sigmoid function, $(v_2, v_6)$ represents the read threshold voltage set for an LSB page, $\widehat{CS}$ represents the estimated checksum value for the data associated with the next read operation, $cs_{max}$ represents the set checksum value and $\theta = \{\theta_0, \theta_1, \ldots, \theta_4\}$ represents the set of parameters.

4. The memory system of claim 3, wherein the set checksum value is determined based on the number of rows of a parity check matrix used for decoding data associated with the read operation.

5. The memory system of claim 3, wherein the controller determines the set of parameters by performing the polynomial regression on an inverse sigmoid function of the mathematical model according to the following equation:
   $$\theta_0 + \theta_1 v_2 + \theta_2 v_2^2 + \theta_3 v_6 + \theta_4 v_6^2 = S^{-1}\left(\frac{cs}{cs_{max}}\right).$$

6. A memory system comprising:
   a memory device including a plurality of pages; and
   a controller configured to:
   obtain meta information associated with read operations on a select page among the plurality of pages, the meta information including multiple read threshold voltage sets, multiple checksum values and percentages of bits of a specific value in data;
   determine a mathematical model for estimating a percentage of bits of a specific value in data for a next read operation, using a set function of the read threshold voltage set used for a current read operation;
   determine a set of parameters by performing linear regression on the mathematical model;
   determine a surface, which is formed by each set of the multiple read threshold voltage sets; determine a line of the surface based on the set of parameters;
   determine a best previous read threshold voltage set among the multiple read threshold voltage sets, based on the multiple checksum values;
   determine a point corresponding to the best previous read threshold voltage set in the surface; and
   estimate a next read threshold voltage for the next read operation by projecting the point onto the line.

7. The memory system of claim 6, wherein the set function includes a sigmoid function, and
   wherein the select page includes a least significant bit (LSB) page of a triple-level cell (TLC).

8. The memory system of claim 7, wherein the mathematical model is a quadratic model represented by the following equation:
   $$\hat{P}_1 = S(\phi_0 + \phi_1 v_2 + \phi_2 v_6)$$
   wherein $S(\bullet)$ denotes the sigmoid function, $(v_2, v_6)$ represents a read threshold voltage set for LSB page, $\hat{P}_1$ represents a percentage of bits of a specific value and $\phi = \{\phi_0, \phi_1, \phi_2\}$ represents the set of parameters.

9. The memory system of claim 8, wherein the controller determines the set of parameters by performing the linear regression on an inverse sigmoid function of the mathematical model according to the following equation:
   $$\phi_0 + \phi_1 v_2 + \phi_2 v_6 = S^{-1}(\hat{P}_1).$$

10. The memory system of claim 8, wherein the specific value is 1.

11. The memory system of claim 8, wherein the controller estimates the next read threshold voltage according to $\phi_0 + \phi_1 v_2 + \phi_2 v_6 = 0$.

12. A memory system comprising:
    a memory device including a plurality of pages; and
    a controller configured to:
    obtain meta information associated with read operations on a select page among the plurality of pages, the meta information including multiple read threshold voltage sets, multiple checksum values and a percentage of bits of a specific value in data;
    determine a first mathematical model for estimating a checksum value data associated with for a next read operation, using a set function of the read threshold voltage set and a set checksum value;
    determine a first set of parameters by performing polynomial regression on the first mathematical model;
    estimate a first next read threshold voltage for the next read operation based on the first set of parameters;
    determine a second mathematical model for estimating a percentage of bits of specific value in data for the next read operation, using a set function of the read threshold voltage set used for a current read operation;
    determine a second set of parameters by performing linear regression on the second mathematical model;
    determine a surface, which is formed by each set of the multiple read threshold voltage sets;
    determine a line of the surface based on the second set of parameters;
    determine a best previous read threshold voltage set among the multiple read threshold voltage sets, based on the multiple checksum values;
    determine a point corresponding to the best previous read threshold voltage set in the surface; and
    estimate a second next read threshold voltage for the next read operation by projecting the point onto the line.

13. The memory system of claim 12, wherein the set function includes a sigmoid function, and
    wherein the select page includes a least significant bit (LSB) page of a triple-level cell (TLC).

14. The memory system of claim 13, wherein the first mathematical model is a quadratic model, which is expressed as:
    $$\widehat{CS} = cs_{max} \times S(\theta_0 + \theta_1 v_2 + \theta_2 v_2^2 + \theta_3 v_6 + \theta_4 v_6^2)$$

wherein S(•) denotes the sigmoid function, $(v_2, v_6)$ represents a read threshold voltage set for LSB page, $\widetilde{cs}$ represents the estimated checksum value for the next read operation, $cs_{max}$ represents the set checksum value and $\theta=\{\theta_0, \theta_1, \ldots, \theta_4\}$ represents the first set of parameters.

15. The memory system of claim 14, wherein the set checksum value is determined based on the number of rows of a parity check matrix used for decoding data associated with the read operation.

16. The memory system of claim 14, wherein the controller determines the first set of parameters by performing the polynomial regression on an inverse sigmoid function of the first mathematical model according to the following equation:

$$\theta_0 + \theta_1 v_2 + \theta_2 v_2^2 + \theta_3 v_6 + \theta_4 v_6^2 = S^{-1}\left(\frac{cs}{cs_{max}}\right).$$

17. The memory system of claim 13, wherein the second mathematical model is a quadratic model represented by the following equation:

$$\hat{P}_1 = S(\phi_0 + \phi_1 v_2 + \phi_2 v_6)$$

wherein S(•) denotes the sigmoid function, $(v_2, v_6)$ represents a read threshold voltage set for LSB page, $\hat{P}_1$ represents a percentage of bits of a specific value and $\phi=\{\phi_0, \phi_1, \phi_2\}$ represents the second set of parameters.

18. The memory system of claim 17, wherein the controller determines the second set of parameters by performing the linear regression on an inverse sigmoid function of the mathematical model according to the following equation:

$$\phi_0 + \phi_1 v_2 + \phi_2 v_6 = S^{-1}(\hat{P}_1).$$

19. The memory system of claim 17, wherein the specific value is 1, and
wherein the controller estimates the second next read threshold voltage according to $\phi_0 + \phi_1 v_2 + \phi_2 v_6 = 0$.

20. The memory system of claim 13, wherein the controller further determines whether the first and second next read threshold voltages are within a set threshold range;
when it is determined that both of the first and second next read threshold voltages are not within the set threshold range, the controller:
divides the set threshold range into multiple zones,
finds a zone corresponding to the lowest number of read operations, among the multiple zones, and
randomly determines, as a next read threshold voltage, any read voltage in the zone.

* * * * *